United States Patent
Joffe et al.

(10) Patent No.: US 9,891,638 B2
(45) Date of Patent: Feb. 13, 2018

(54) SYSTEMS AND METHODS FOR COMMUNICATING HIGH SPEED SIGNALS IN A COMMUNICATION DEVICE

(71) Applicants: Daniel M. Joffe, Owens Crossroads, AL (US); W. Stuart Venters, Huntsville, AL (US); Vern Brethour, Owens Crossroads, AL (US)

(72) Inventors: Daniel M. Joffe, Owens Crossroads, AL (US); W. Stuart Venters, Huntsville, AL (US); Vern Brethour, Owens Crossroads, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 14/933,771

(22) Filed: Nov. 5, 2015

(65) Prior Publication Data

US 2017/0131730 A1   May 11, 2017

(51) Int. Cl.
*G05F 1/46* (2006.01)
*H03H 11/04* (2006.01)
(Continued)

(52) U.S. Cl.
CPC .............. *G05F 1/461* (2013.01); *G05F 3/18* (2013.01); *G05F 5/00* (2013.01); *H03H 11/04* (2013.01);
(Continued)

(58) Field of Classification Search
CPC .......... G05F 1/461; G05F 1/561; G05F 1/575; G05F 3/18; G05F 5/00; H03H 11/04;
(Continued)

(56) References Cited

U.S. PATENT DOCUMENTS

| | | |
|---|---|---|
| 3,806,807 A | 4/1974 | Nakamura |
| 5,081,647 A | 1/1992 | Bremer |
| (Continued) | | |

FOREIGN PATENT DOCUMENTS

AT   DE 3525201 A1 *   1/1986   ............. H03H 11/04

OTHER PUBLICATIONS

Holland, "Interfacing Between LVPECL, VML, CML, and LVDS Levels," Texas Instruments, pp. 1-23, Dec. 2002.
(Continued)

*Primary Examiner* — Young T Tse
(74) *Attorney, Agent, or Firm* — Maynard Cooper & Gale, P.C.; Jon E. Holland

(57) ABSTRACT

A coupling module can be used to communicate high speed signals between an optical transceiver and a processing module of an optical communication device, such as an optical line termination (OLT) or an optical network unit (ONU). The coupling module can adjust the DC offset voltage level of the signal output by the optical transceiver to the DC offset voltage level required by the processing module. In addition, the coupling module splits the output signal from the optical transceiver and passes the signal to both a high pass filter and a low pass filter that are connected in parallel. The outputs of the high pass filter and the low pass filter are then combined and provided to the processing module. The high pass filter and the low pass filter can be configured such that all frequencies of the signal from the optical transceiver are provided to the processing module.

27 Claims, 9 Drawing Sheets

(51) Int. Cl.
*H03H 11/12* (2006.01)
*H04B 3/54* (2006.01)
*H04L 25/06* (2006.01)
*G05F 3/18* (2006.01)
*G05F 5/00* (2006.01)

(52) U.S. Cl.
CPC ....... *H03H 11/0472* (2013.01); *H03H 11/126* (2013.01); *H04B 3/548* (2013.01); *H04L 25/061* (2013.01)

(58) Field of Classification Search
CPC ............ H03H 11/0405; H03H 11/0411; H03H 11/0422; H03H 11/0427; H03H 11/0433; H03H 11/0455; H03H 11/0461; H03H 11/0466; H03H 11/0472; H03H 11/0477; H03H 11/0483; H03H 11/0488; H03H 11/0494; H03H 11/12; H03H 11/1204; H03H 11/1213; H03H 11/1217; H03H 11/1226; H03H 11/126; H03H 11/1269; H04B 3/548; H04B 3/56; H04L 25/06; H04L 25/061
USPC ............... 375/219, 220, 222, 257, 318, 319; 333/109, 111, 24 R, 165–168, 172, 173, 333/180, 181, 186, 192, 202, 24 C; 398/135, 137, 139; 455/338–341
See application file for complete search history.

(56) References Cited

U.S. PATENT DOCUMENTS

| | | | |
|---|---|---|---|
| 5,528,172 A | 6/1996 | Sundstrom | |
| 5,572,156 A | 11/1996 | Diazzi et al. | |
| 7,212,012 B1* | 5/2007 | Zhang | H02M 3/156 323/285 |
| 8,527,283 B2* | 9/2013 | Jasiuk | G10L 21/038 704/205 |
| 2010/0277215 A1* | 11/2010 | Tam | H03F 3/211 327/333 |
| 2013/0258312 A1* | 10/2013 | Lewis | G01S 7/4865 356/4.01 |
| 2015/0155874 A1 | 6/2015 | Scandiuzzo et al. | |

OTHER PUBLICATIONS

"Interfacing LVPECL 3.3V Drivers with Xilinx 2.5 V Differential Receivers," XILINX, Application Note: Virtex-II Pro, Virtex-4, Virtex-5, Spartan-3/3E Families, May 1, 2008.
PAS5351, PAS5361 Epon Burst Receiver, "Gigabit Ethernet PON Burst Receiver for CO and OLT Transceiver Applications," PMC-Sierra, 2006.

* cited by examiner

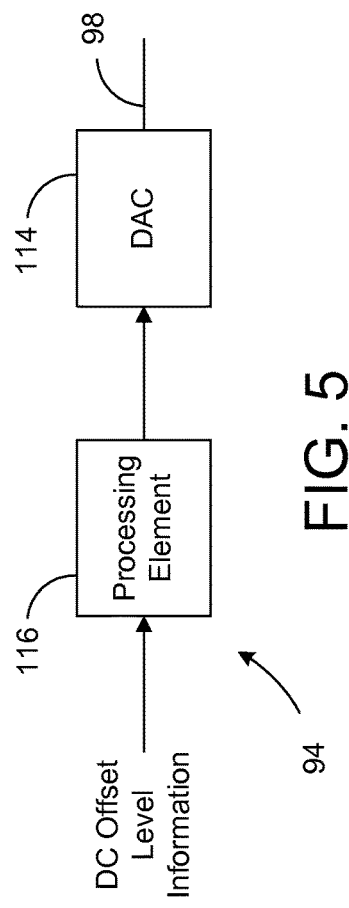
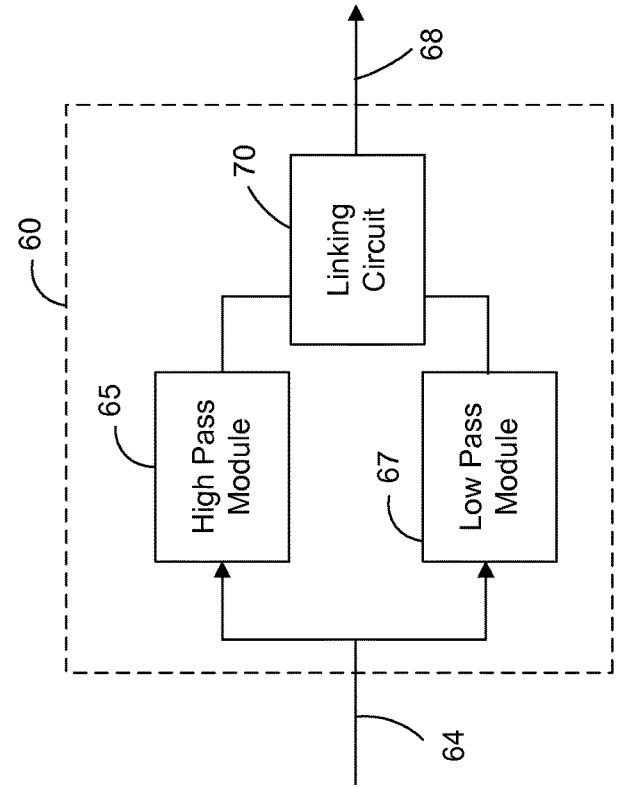

SYSTEMS AND METHODS FOR COMMUNICATING HIGH SPEED SIGNALS IN A COMMUNICATION DEVICE

BACKGROUND

The present application generally relates to systems and methods for communicating high speed signals between a transceiver and a processing module in a communication device, such as an optical line termination.

In an optical line termination, an optical transceiver receives an optical signal modulated with a data stream from an optical network unit and converts the optical signal to an electrical signal. The electrical signal from the optical transceiver is provided to a processing module for further processing as may be desired. Frequently, the optical transceiver and the processing module are provided in separate circuits (possibly in separate cards or separate integrated circuits) having different DC (direct current) offset voltage level or common mode voltage level requirements. For example, the optical transceiver can output a signal having a DC offset voltage or common mode voltage (e.g., 3.3 V) that is significantly greater than the DC offset voltage or common mode voltage (e.g., 1.2 V) for the signal that can be received by the processing module. Thus, the electrical signal from the optical transceiver cannot be provided directly to the processing module because the processing module is not equipped to handle the signal with the higher DC offset voltage or common mode voltage.

For compatibility between the optical transceiver and the processing module, the DC offset voltage or common mode voltage for the signal from the optical transceiver has to be level shifted so that the signal can be received by the processing module. One way to couple the optical transceiver to the processing module to obtain the desired level shift is with a resistive divider. However, a drawback of the resistive divider is that the resistive divider discards a significant amount of the signal being communicated between the optical transceiver and the processing module. Another way to couple the optical transceiver to the processing module to obtain the desired level shift is with capacitive coupling. One drawback to capacitive coupling is that the coupling capacitors do not provide an appropriate DC response if there are long idle times or long strings of "1s" or "0s" in the data stream. Still another way to couple the optical transceiver to the processing module to obtain the desired level shift is with bus transceivers. A drawback to the use of the bus transceivers is that they undesirably introduce jitter into the signal.

SUMMARY

The present application generally pertains to a coupling module in a communication device, such as an optical line termination (OLT) or optical network unit (ONU), that communicates high speed signals, i.e., signals transmitted at 1 Gbps (Gigabit per second) or greater, between a transceiver and a processing module. The coupling module can adjust the DC offset voltage level or the common mode voltage level of the signal output by the transceiver to the DC offset voltage level or common mode voltage level desired for the processing module. The coupling module splits the output signal from the transceiver and passes the signal to both a high pass filter and a low pass filter that are connected in parallel. The outputs of the high pass filter and the low pass filter are then combined and provided to the processing module. The high pass filter and the low pass filter can be configured such that all or one or more predetermined ranges of frequencies of the signal from the transceiver are provided to the processing module without any significant phase shift. In addition, the coupling module can include a level shifter that is incorporated with the low pass filter. The level shifter adjusts the DC offset voltage or the common mode voltage from the transceiver to the DC offset voltage or the common mode voltage required by the processing module. The level shifter can be a shunt regulator or an operational amplifier. Both the shunt regulator and the operational amplifier can be configured to provide the appropriate level shift of the DC offset voltage or the common mode voltage such that the processing module receives the proper DC offset voltage or the common mode voltage regardless of the DC offset voltage or the common mode voltage provided by the transceiver.

One advantage of the present application is the jitter-free communication of high speed signals between an optical transceiver and a processing module in an optical communication device.

Another advantage of the present application is that the coupling module can simultaneously provide DC coupling, signal integrity, and wide (GHz to multi-GHz) bandwidth while maintaining signal swing.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

FIG. 5 is a block diagram showing an embodiment of the offset module of the coupling module of FIG. 4.

FIG. 7 is a block diagram showing another embodiment of the coupling module.

Wherever possible, the same reference numbers are used throughout the drawings to refer to the same or like parts.

DETAILED DESCRIPTION

The present application generally pertains to a coupling module connecting an optical transceiver and a processing module in an optical communication device, such as an optical line termination (OLT) or optical network unit (ONU). The coupling module can include a coupling network that connects a driver circuit of the optical transceiver to a receiver circuit of the processing module. In one embodiment, the coupling network is a purely passive high pass filter in parallel with an op-amp (operational amplifier) based, unity gain, low pass filter. The high pass filter can include a capacitor to provide jitter free communications. The low pass filter can be coupled to the high pass filter on the receiver side of the connection with a linking circuit. The low pass filter can include a carefully selected inductor that has acceptable low parasitic capacitance connected to the output of the op-amp. The inductor operates to protect the high speed signals from the high pass filter from being severely attenuated by the low impedance of the output of the op-amp. Alternatively, the low pass filter can include a resistor and a capacitor connected in parallel at the output of the op-amp. The high pass filter and the low pass filter are tuned to preserve the signals in the transition region between the two filters. However, in other embodiments, there can be gap in the transition region between the high pass filter and the low pass filter. The gap in the transition region between the filters can be predefined by tuning both the high pass filter and the low pass filter such that the parameters, e.g., width, of the gap are known. In a further embodiment, one or both of the high pass filter and the low pass filter may not be tuned and may result in a gap in the transition region. In still another embodiment, the coupling network can include a shunt regulator powered by signals from the driver circuit to achieve a precise, temperature independent, level shift. The high pass filter is produced by bypassing the regulator with a capacitor, or capacitor-resistor combination connected in parallel.

Figure 1:
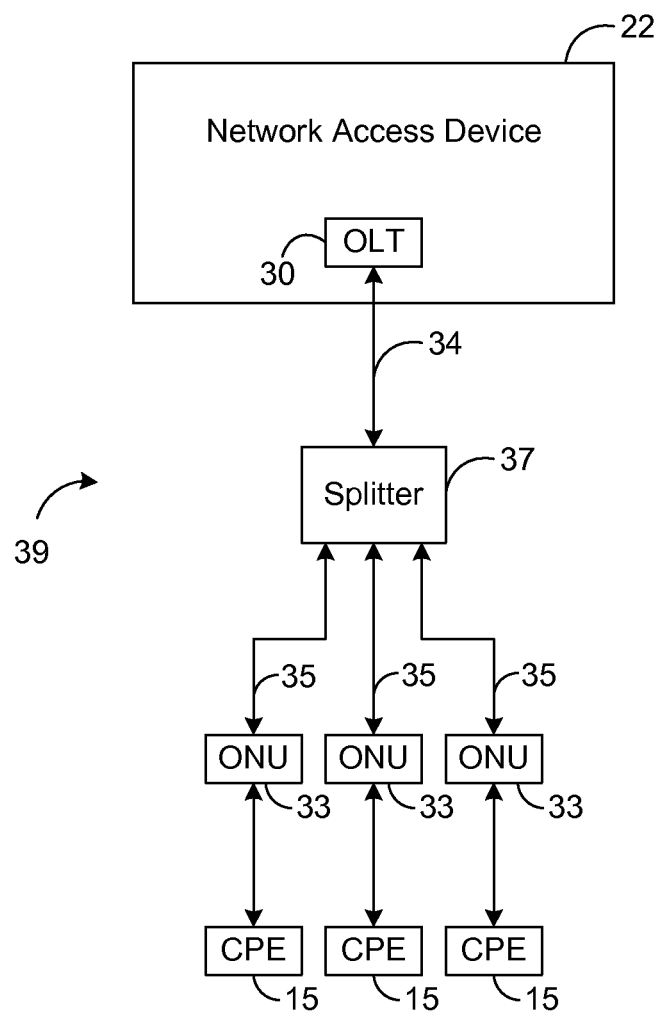
FIG. 1 is a block diagram showing an embodiment of a passive optical network.

FIG. 1 depicts an embodiment of a passive optical network (PON) 39 for communicating data with customer premises equipment (CPE) 15. Examples of PONs and telecommunication systems that can be used with the present application is described in commonly-assigned U.S. patent application Ser. No. 14/706,732, entitled "Telecommunication Systems and Methods Using Dynamic Shaping for Allocating Network Bandwidth" and filed on May 7, 2015, which is incorporated herein by reference.

As shown by FIG. 1, the PON 30 includes an optical line termination (OLT) 30. In one embodiment, the OLT 30 resides on a line card of a network access device (NAD) 22, which may include other OLTs of other PONs, as is described by U.S. patent application Ser. No. 14/706,732. The NAD 22 can be used to facilitate communications, both upstream and downstream, between the CPEs 15 and a telecommunication network (not shown). As an example, the network access device 22 may reside at a central office of a telecommunication network or an intermediate point between a central office and the CPEs 15

The OLT 30 can be coupled to an optical splitter 37 by an optical fiber 34, and the optical splitter 37 is configured to split signals from the OLT 30 across multiple optical fibers 35 that are respectively coupled to ONUs 33 as shown. Each ONU 33 can receive at least one packet flow from the OLT 30 and convert the received packet flow(s) from the optical domain to the electrical domain. The OLT 30 and the optical components coupled to it, including the optical splitter 37, ONUs 33, and optical fibers 34, 35 form the PON 39. In one embodiment, the PON 39 is a gigabit passive optical network (GPON).

Figure 2:
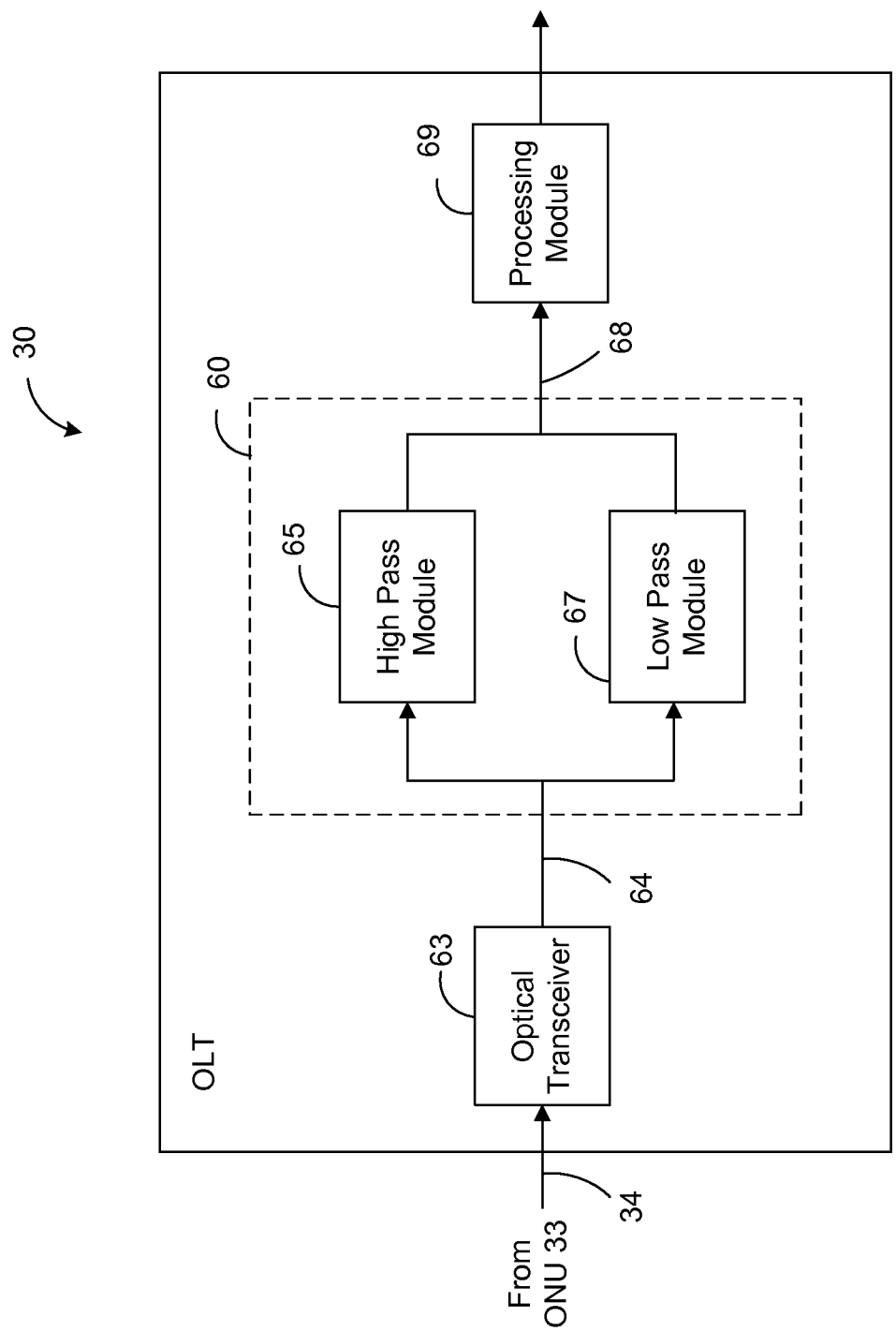
FIG. 2 is a block diagram showing various components of an embodiment of an optical line termination.

FIG. 2 shows an embodiment of an OLT 30 with the components used for processing upstream communications from the ONU 33. It is to be understood that the OLT 30 shown in FIG. 2 may include additional equipment and/or components to perform additional functions and operations that are not shown in FIG. 2, e.g., the processing of downstream communications. The OLT 30 can have an optical transceiver 63 that receives an upstream optical signal from an ONU 33 via optical fiber 34. The signal carries a data stream transmitted by the ONU 33. In one embodiment, the signal from the ONU 33 can be a high speed signal carrying the data stream at a data rate of between about 1 Gbps and about 10 Gbps or greater. The optical transceiver 63 converts the received optical signal to an electrical signal and provides the electrical signal to an input connection 64 of the coupling module 60. The coupling module 60 adjusts the level of the DC offset voltage or common mode voltage of the electrical signal and provides the signal with the adjusted DC offset or common mode voltage to a processing module 69 via output connection 68. Note that in one embodiment all of the components of the OLT 30 can reside on a printed circuit board (PCB), referred to as a "line card." In other embodiments, other configurations of the OLT 30 are possible.

The optical transceiver 63 can include a photo detector or avalanche photo diode to convert the optical signal to an electrical signal. The optical transceiver 63 can also include an amplifier circuit such as a trans-impedance amplifier and a driver circuit to provide the electrical signal to the input connection 64 of the coupling module 60. In addition, the optical transceiver 63 can be configured to be either DC coupled or AC (alternating current) coupled. The AC coupled optical transceiver 63 includes a capacitor connected between the driver circuit and an output connection coupled to the input connection 64 of the coupling module 60. The DC offset voltage or the common mode voltage of the electrical signal from the optical transceiver 63 can range between about 2.5 V and about 3.3 V, although other voltage ranges are possible in other embodiments.

The processing module 69 can include a receiver circuit to receive the signal from an output connection 68 of the coupling module 60. The processing module 69 can also include a field programmable gate array (FPGA) and/or other electrical components to further process the received signal. In one embodiment, the DC offset voltage or the common mode voltage of the electrical signal provided on the output connection 68 from the coupling module 60 can be less than about 1.2 V to correspond to the desired DC offset voltage of the processing module 69. In one embodiment, the required DC offset voltage of the processing module 69 may be known. However, in other embodiments, the required DC offset voltage of the processing module 69 may have to be discovered or learned.

The coupling module 60 splits the electrical signal from the input connection 64 into two (2) signals and provides one signal to a high pass module 65 and the other signal to a low pass module 67. The high pass module 65 filters the low frequency signals from the electrical signal and permits the high frequency signals to pass to the output connection 68. The low pass module 67 filters the high frequency signals from the electrical signal and permits the low frequency signals to pass to the output connection 68. In addition, the low pass module 67 also shifts or adjusts the level of the DC offset voltage of the electrical signal such that the DC offset voltage level is acceptable for the processing module 69. The coupling module 60 combines the output of the high pass module 65 and the low pass module 67 at output connection 68.

Figure 3A:
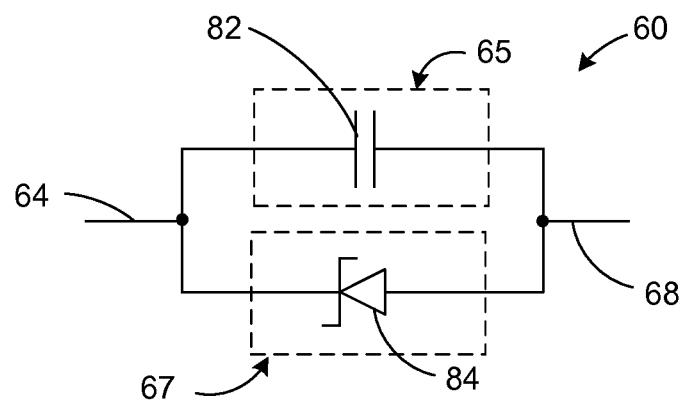
FIGS. 3A and 3B are circuit diagrams showing embodiments of a coupling module.
Figure 3B:
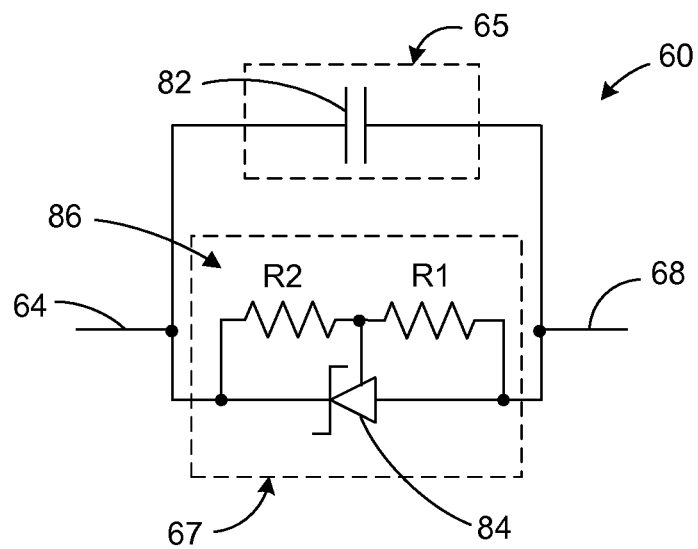

FIGS. 3A and 3B show related embodiments of the coupling module 60 that can be used in the present application. In the embodiment of FIG. 3A, the high pass module 65 includes a capacitor 82 to filter the low frequency signals in the electrical signal from the optical transceiver 63 and permit the high frequency signals to pass to the output connection 68. In one embodiment, the capacitor 82 can have a capacitance of about 0.1 µF. In another embodiment, the capacitor 82 can have a capacitance of about 0.01 µF.

However, capacitor 82 may use different capacitances in still other embodiments. The low pass module 67 can include a voltage regulator such as a shunt regulator 84 connected in series with input connection 64 and in parallel to capacitor 82 to block the high frequency signals above a predetermined frequency in the electrical signal and permit the low frequency signals below the predetermined frequency in the electrical signal to pass to output connection 68. The high frequency signals can be provided to the output connection 68 via capacitor 82. In addition, the shunt regulator 84 can provide a fixed voltage drop for the DC offset voltage in the electrical signal. In one embodiment, the shunt regulator 84 selected for the low pass module 67 can have a voltage drop that directly corresponds to the required level shift in the DC offset voltage in the electrical signal from the optical transceiver 63 to enable the signal at the output connection 68 to be received by the processing module 69.

The embodiment of FIG. 3B is similar to the embodiment of FIG. 3A except that the shunt regulator 84 is connected in parallel to a resistor network 86 to adjust the voltage drop to the DC offset voltage in the electrical signal provided by the shunt regulator 84. In one embodiment as shown in FIG. 3B, the voltage drop provided by the shunt regulator 84 ($V_{DR}$) can be based on the gate to anode voltage ($V_{GA}$) of the shunt regulator 84 as determined by equation 1.

$$V_{DR}=(1+(R2/R1))*V_{GA} \quad (1)$$

Figure 4:
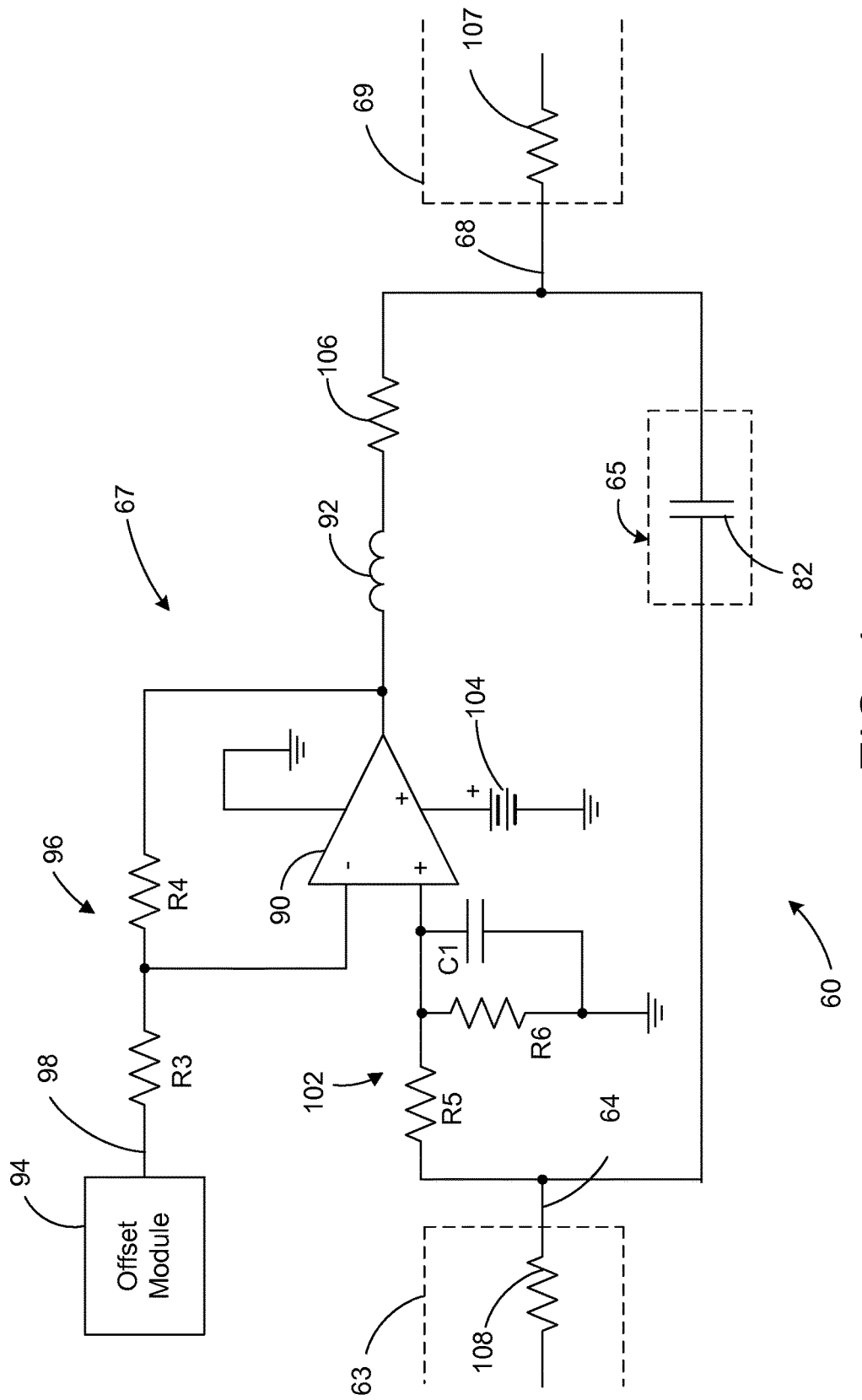
FIG. 4 is a circuit diagram showing another embodiment of the coupling module.

FIG. 4 shows another embodiment of the coupling module 60 that can be used in the present application. In the embodiment of FIG. 4, the high pass module 65 includes capacitor 82 to filter out the low frequency signals in the electrical signal from the optical transceiver 63 and permit the high frequency signals in the electrical signal from the optical transceiver 63 to pass to the output connection 68. The low pass module 67 can include an op-amp 90 connected in series with an inductor 92 to filter out the high frequency signals in the electrical signal from the optical transceiver 63 and permit the low frequency signals in the electrical signal from the optical transceiver 63 to pass to the output connection 68. The op-amp 90 and the inductor 92 are connected in parallel to capacitor 82. In one embodiment, the inductor 92 can be a VISHAY IFSC0806AZER220M1 inductor having an inductance of about 22 µH and a low parasitic capacitance, e.g., less than 1 pF, to prevent the high frequency signals passed by capacitor 82 from reaching the low impedance at the output of the op-amp 90. Other inductors having different inductances and different parasitic capacitances may be used in other embodiments.

The op-amp 90 is used to control the level of the DC offset voltage or the common mode voltage provided at output connection 68 based on an input voltage (or offset control voltage) from an offset module 94. In one embodiment, the op-amp 90 can be a Texas Instruments OPA2830 providing sufficient bandwidth and a low noise figure. However, other op-amps having different bandwidths and noise figures may be used in other embodiments.

The offset module 94 is connected to a feedback circuit 96 for the op-amp 90 at connection 98. The feedback circuit 96 can also be connected to the output of the op-amp 90 and the inverting input for the op-amp 90. In the embodiment shown in FIG. 4, the feedback circuit 96 includes resistors R3 and R4. In one embodiment, R3 can have a resistance between about 2 kΩ and about 10 kΩ and R4 can have a resistance between about 2 kΩ and about 22 kΩ. However, other resistances may be used for resistors R3 and R4 in other embodiments.

In addition, the op-amp 90 can include an input circuit 102 connected between the input connection 64 and the non-inverting input to the op-amp 90. The input circuit 102 can include a low pass filter to prevent the op-amp 90 from receiving (and having to process) higher frequency signals. In the embodiment shown in FIG. 4, the input circuit 102 can include resistors R5 and R6 and a capacitor C1. In one embodiment, the low pass filter of input circuit 102 (which includes resistor R6 and capacitor C1) can be part of a positive feedback circuit for op-amp 90 during a transition between the low pass filter function of the low pass module 67 and the high pass filter function of the high pass module 65. During the transition between the low pass filter and the high pass filter, the positive feedback circuit for op-amp 90 (which includes the low pass filter of input circuit 102) can operate similar to a band pass filter to provide an output signal at the output connection 68 for any frequencies of the electrical signal from the optical transceiver 63 that may be between the low pass response of the low pass module 67 and the high pass response of the high pass module 65. In one embodiment, the capacitor C1 can have a capacitance of about 47 pF and resistors R5 and R6 can each have a resistance of about 2 kΩ. However, in other embodiments, other capacitances may be used for capacitor C1, and other resistances may be used for resistors R5 and R6. The op-amp 90 can also be powered by a voltage source 104. In one embodiment, the voltage source 104 can be 3.3 V, but different voltages can be used in other embodiments.

The low pass module 67 can also include a resistor 106 connected in series with the inductor 92 to form an output circuit for the op-amp 90. The resistor 106 can be used in conjunction with inductor 92 to tune the low frequency response of the low pass module 67, i.e., the signal frequency from which the low pass module 67 will no longer pass the electrical signal to the output connection 68. The low frequency response can be determined based on the selection of the inductance for inductor 92 and the resistance for resistor 106. In one embodiment, resistor 106 can have a resistance of about 50Ω. However, other resistances may be used for resistor 106 in other embodiments.

The processing module 69 can include a resistor 107 connected to the capacitor 82. Similarly, the optical transceiver 63 can include a resistor 108 connected to the capacitor 82. The resistor 107 and the resistor 108 can be used in conjunction with capacitor 82 to set the high frequency response of the high pass module 65, i.e., the signal frequency below which the high pass module 65 will no longer pass the electrical signal to the output connection 68. The high frequency response can be determined based on the selection of the capacitance for capacitor 82 after accounting for the resistances of resistor 108 and resistor 107 as established in their respective devices.

In one embodiment, the capacitor 82, resistor 107, resistor 108, inductor 92 and resistor 106 can be configured as a Boucherot cell or a Zobel network. The capacitor 82 can be configured to provide a predetermined high frequency response based on the known resistances for resistor 107 and resistor 108, and the inductor 92 and resistor 106 can be configured to provide a predetermined low frequency response such that when combined with the predetermined high frequency response, the predetermined high frequency response overlaps with the predetermined low frequency response for a minimal frequency range to provide the output connection 68 with all the frequencies of the electrical signal without any substantial phase shift in the signals.

Figure 10:
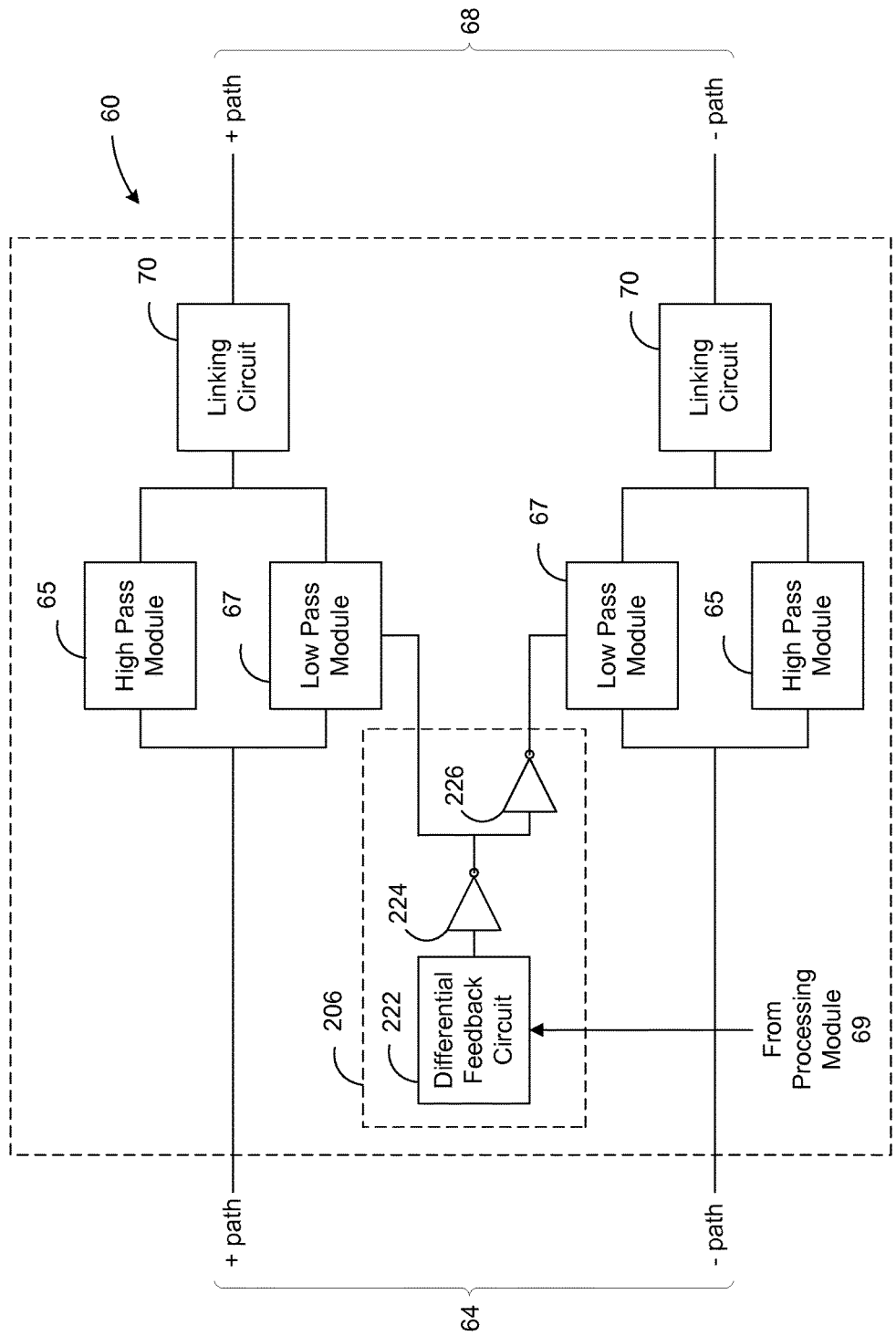
FIG. 10 is a block diagram showing an embodiment of the coupling module for a differential signal.

In one embodiment, the optical transceiver 63 can communicate with the processing module 69 using a differential signal transmitted over two connections, e.g., a positive connection and a negative connection. Thus, the embodiments of FIGS. 3A, 3B, 4, 6 (as described below), 8 (as described below) and 9 (as described below), if used with a differential signal, would be connected between each of the input connections 64 and the output connections 68 for the differential signal as shown in FIG. 10.

In another embodiment, a comparator circuit can be connected between the optical transceiver 63 and the input connection 64 to determine whether the optical transceiver 63 is AC coupled or DC coupled. The determination of whether the optical transceiver 63 is AC coupled or DC coupled is used to change the voltage provided by the offset module 94 to the op-amp 90 to adjust the DC offset voltage or the common mode voltage provided by the op-amp 90 to accommodate the coupling configuration of the optical transceiver 63. In addition, if the optical transceiver 63 is AC coupled, the comparator circuit can also be used to apply a reference bias to the input circuit 102 for op-amp 90. In one embodiment, the comparator circuit can include a comparator output that goes high when the optical transceiver 63 is DC coupled.

FIG. 5 shows an embodiment of the offset module 94 used to provide the input voltage to the op-amp 90 to control the level shift of the DC offset voltage or the common mode voltage provided at output connection 68.

A digital to analog converter (DAC) 114 provides the input voltage for op-amp 90 at connection 98. The DAC 114 receives a value from a processing element 116, such as an FPGA, that corresponds to the desired output from the DAC 114, i.e., the input voltage at connection 98. The processing element 116 receives DC offset level information and then uses the DC offset level information to generate the input value for the DAC 114. In one embodiment, the processing element 116 communicates with the comparator circuit or the optical transceiver 63 to obtain information on the DC offset level output by the optical transceiver 63 based on the type of equipment in optical transceiver 63. In another embodiment, the processing element 116 may receive information directly from the optical transceiver 63 or the processing module 69 via a communication bus that informs the processing element 116 whether the optical transceiver 63 is AC coupled or DC coupled.

In an alternate embodiment, the processing element 116 can communicate with a DC offset level circuit 120 (see FIG. 6) coupled to the processing module 69 to obtain information regarding the DC offset voltage level to be received by the processing module 69. The processing element 116 can also store (or obtain) information relating to the DC offset level required by the processing module 69. The processing element 116 can then use the DC offset level information from the processing module 69 to determine the level shift required from the low pass module 67. The processing element 116 can then generate the signal or value for the DAC 114 to obtain the proper input voltage for op-amp 90 so the op-amp 90 can provide the proper DC offset voltage or the common mode voltage for the processing module 69.

Figure 6:
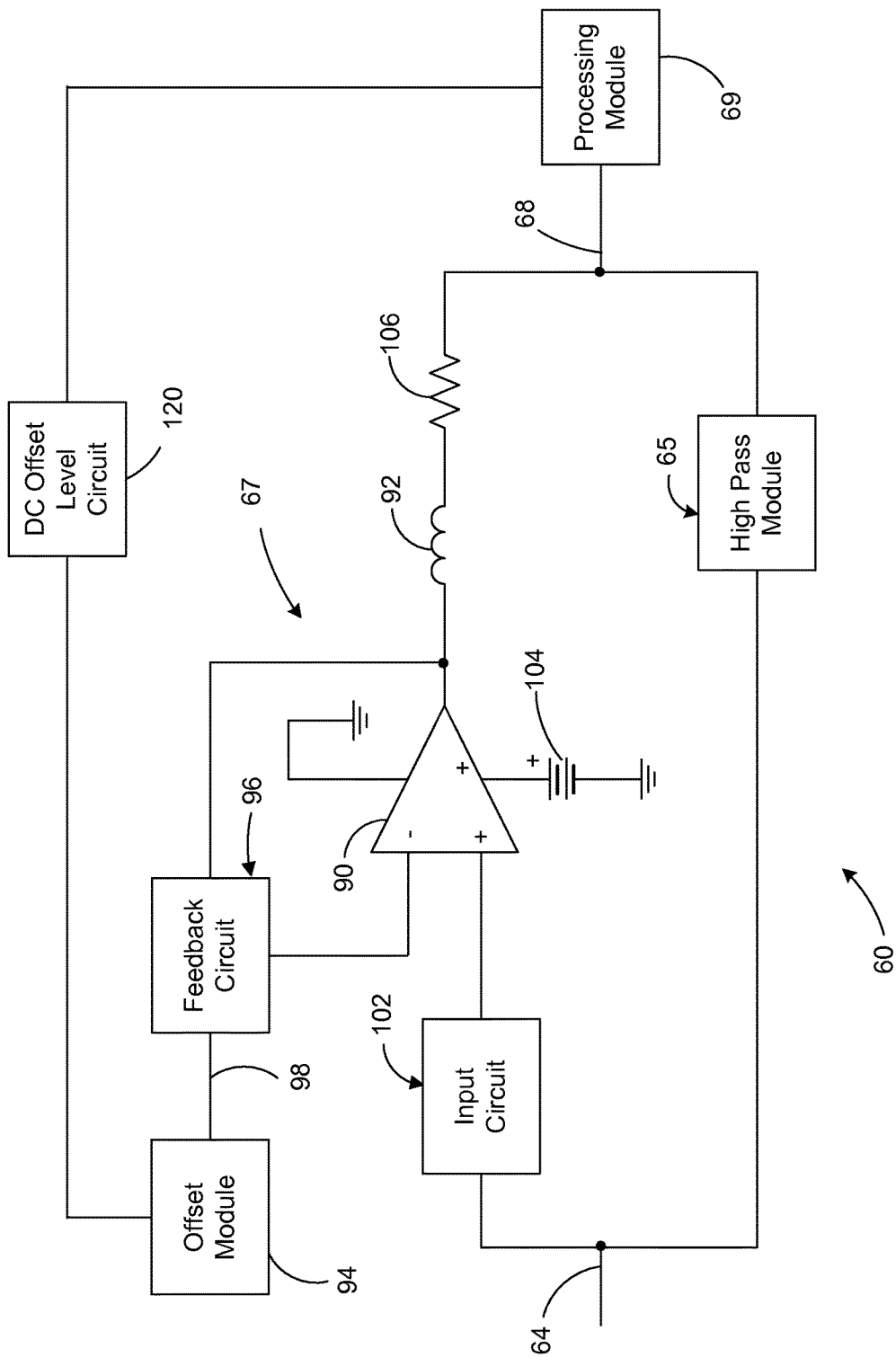
FIG. 6 is a circuit diagram showing alternate embodiment of the coupling module of FIG. 4.

FIG. 6 shows an embodiment of a coupling module 60 similar to the embodiment of the coupling module 60 shown in FIG. 4. However, the coupling module 60 of FIG. 6 also includes a DC offset level circuit 120 connected between the processing module 69 and the offset module 94 of the coupling module 60. The DC offset level circuit 120 can receive information or feedback from the processing module 69 and then use the information from the processing module 69 to control the offset module 94 to provide a voltage to the op-amp 90 such that the op-amp 90 provides a desired level in the DC offset voltage.

In one embodiment, the DC offset level circuit 120 can use information from the processing module 69 to control the offset module 94 to set the level shift of the DC offset voltage in op-amp 90 to account for the optical transceiver 63 being either AC coupled or DC coupled. In addition, the DC offset level circuit 120 can use information from the processing module 69 to control the offset module 94 to make minor adjustments to the DC offset voltage from op-amp 90, e.g., increase the voltage or decrease the voltage, to obtain an optimal DC offset voltage for the processing module 69. Further, after establishing the optimal DC offset voltage for the processing module 69, the DC offset level circuit 120 can ensure that the optimal DC offset voltage is still being received by the processing module 69. If the optimal DC offset voltage is not being received by the processing module 69, the DC offset level circuit 120 can control the shift module 94 to make minor adjustments to the DC offset voltage from op-amp 90 to re-establish the optimal DC offset voltage for the processing module 69. As shown in FIG. 6, the offset module 94 provides the input voltage to the inverting (−) input of the op-amp 90. However, in another embodiment, the offset module 94 can provide a second input voltage to the non-inverting (+) input of the op-amp 90 to further control the DC offset voltage provided by the op-amp 90.

FIG. 7 shows another embodiment of the coupling module 60. The embodiment of the coupling module 60 shown in FIG. 7 includes a linking circuit 70 connecting the high pass module 65 and the low pass module to the output connection 68. Similar to the embodiment of the coupling module 60 shown in FIG. 2, the coupling module 60 splits the electrical signal from the input connection 64 into two (2) signals and provides one signal to a high pass module 65 and the other signal to a low pass module 67. The high pass module 65 filters the low frequency signals from the electrical signal and permits the high frequency signals to pass to the output connection 68. The low pass module 67 filters the high frequency signals from the electrical signal and permits the low frequency signals to pass to the output connection 68. In addition, the low pass module 67 also shifts or adjusts the level of the DC offset voltage of the electrical signal. The linking circuit 70 combines the output of the high pass module 65 and the low pass module 67 at output connection 68.

Figure 8:
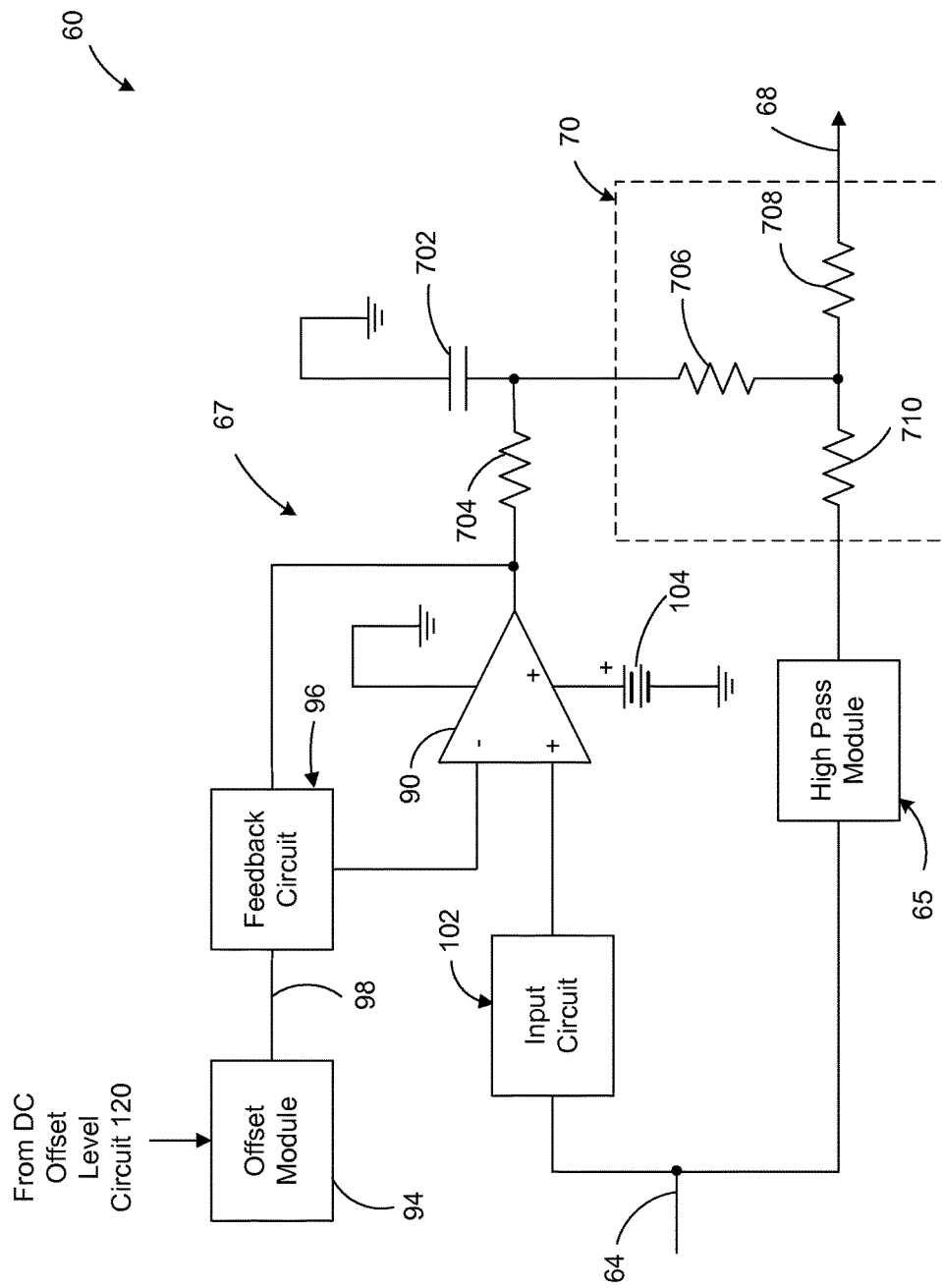
FIG. 8 is a circuit diagram showing an embodiment of the coupling module of FIG. 7.

FIG. 8 shows an embodiment of a coupling module 60 similar to the embodiment of the coupling module 60 shown in FIG. 4. However, the low pass module 67 of FIG. 8 does not include inductor 92 and resistor 106 as the output circuit, but instead includes a capacitor 702 and resistor 704 connected to the output of the op-amp 90 as the output circuit. The capacitor 702 and resistor 704 can be configured to filter out the high frequency signals in the electrical signal from the optical transceiver 63 and permit the low frequency signals in the electrical signal from the optical transceiver 63 to pass to the output connection 68. The resistor 704 can be connected in series with the output of the op-amp 90 and the capacitor 702 can be connected in parallel with the resistor 704. The capacitor 702 and resistor 704 can be configured to provide a predetermined low frequency response such that when combined with the predetermined high frequency response, the predetermined high frequency response and the predetermined low frequency response are tuned to provide the output connection 68 with all the frequencies of the electrical signal without any substantial phase shift in the signals. In one embodiment, the capacitor 702 can have a capacitance of about 0.1 µF and the resistor 704 can have a resistance of about 40Ω, but the capacitor 702 and resistor 704 may have different values in other embodiments.

In addition, FIG. 8 also shows the linking circuit 70 connecting the high pass module 65 and the low pass module 67 to the output connection 68. The linking circuit 70 can be an attenuator circuit that can be used to match the gain of the high pass path through the high pass module 65 to the gain of the low pass path through the low pass module 67 in order to obtain a flat frequency response. In one embodiment, the linking circuit 70 can include a resistor 710 connected in series with the output of the high pass module 65 (capacitor 82), a resistor 708 connected in series between resistor 710 and output connection 68, and a resistor 706 connected in parallel between resistor 710 and resistor 704. In one embodiment, resistor 708 and resistor 710 can each have a resistance of about 9Ω and resistor 706 can have a resistance of about 140Ω. However, other resistances may be used for resistors 706, 708 and 710 in other embodiments. In another embodiment, the linking circuit 70 can also operate as a 50Ω constant impedance, 3 dB attenuator to attenuate any reflections that may occur between the optical transceiver 63 and the processing module 69. While the linking circuit 70 (attenuator) has been shown in a "T" configuration in FIG. 8, the linking circuit 70 may have other configurations in other embodiments.

Figure 9:
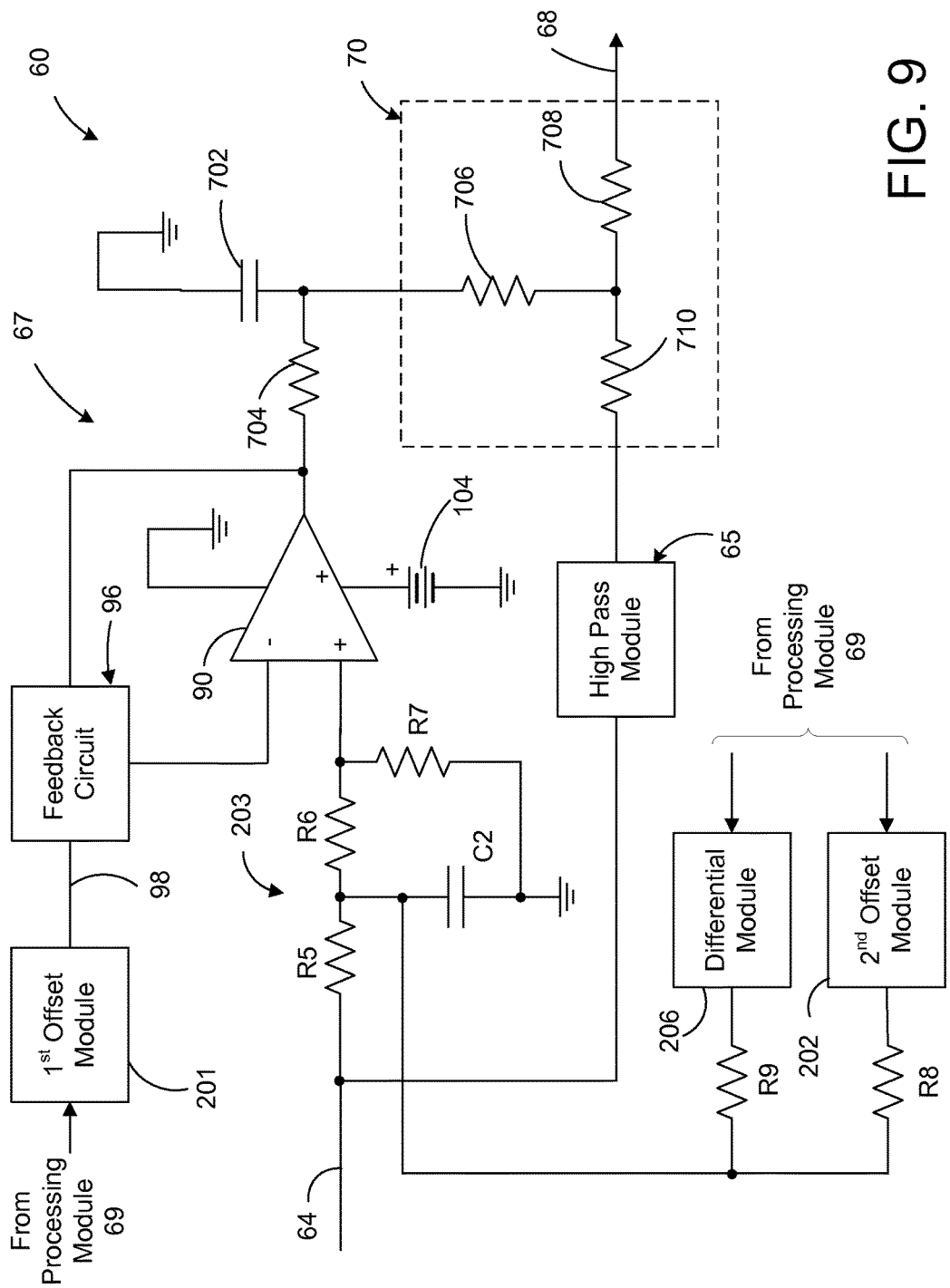
FIG. 9 is a circuit diagram showing another embodiment of the coupling module of FIG. 7.

FIG. 9 shows an embodiment of a coupling module 60 similar to the embodiment of the coupling module 60 shown in FIG. 8. However, the offset module 94 of FIG. 8 has been replaced with a first offset module 201 and a second offset module 202 and input circuit 102 has been replaced with input circuit 203. In addition, a differential module 206 is connected to the input circuit 203.

First offset module 201 and second offset module 202 can be used to control the DC offset voltage that is provided by op-amp 90. First offset module 201 can provide an input voltage for the inverting (−) input of op-amp 90 and can be used for fine or smaller adjustments, e.g., 0.1 V adjustments, of the DC offset voltage from op-amp 90 to optimize the performance of the processing module 69. The first offset module 201 can receive information from processing module 69 regarding the desired DC offset voltage for the processing module 69. The first offset module 201 can use the information from the processing module 69 to determine the appropriate input voltage to provide to connection 98 to obtain the desired DC offset voltage from the op-amp 90. In one embodiment, the first offset module 201 can include a duty-cycle integrating DAC, but other configurations of the first offset module 201 can be used to obtain the desired voltage at connection 98.

The second offset module 202 can provide an input voltage for the non-inverting (+) input of the op-amp 90 and can be used for gross or larger adjustments, e.g., 0.5 V adjustments, of the DC offset voltage to account for the optical transceiver 63 being AC coupled. The second offset module 202 can receive information from the processing module 69 regarding whether the optical transceiver 63 is AC coupled or DC coupled. In one embodiment, the processing module 69 has to discover whether the optical transceiver 63 is AC coupled or DC coupled through a trial and error process. In another embodiment, the processing element 69 may receive information directly from the optical transceiver 63 via a communication bus that informs the processing element 69 whether the optical transceiver is AC coupled or DC coupled. If the optical transceiver 63 is DC coupled, the second offset module 202 can be disabled or "no-loaded" in one embodiment. The second offset module 202 can use the information from the processing module 69 to determine the appropriate input voltage to provide to the input circuit 203 (which is connected to the non-inverting input of op-amp 90) through resistor R8. In one embodiment, the second offset module 202 can include a PNP transistor having a pull-up voltage of 3.3 V, but other configurations of the second offset module 202 can be used to provide the desired voltage to input circuit 203. In one embodiment, resistor R8 can have a resistance of about 3.5 kΩ, but can have other resistances in other embodiments.

The input circuit 203 can be connected between input connection 64 and the non-inverting input of the op-amp 90. The input circuit can include a resistor R5 connected to the input connection 64 and a resistor R6 connected between resistor R5 and the non-inverting input to the op-amp 90. A capacitor C2 is connected between resistor R5 and a ground connection and resistor R7 is connected between resistor R6 and the ground connection. In addition, the inputs from the second offset module 202 and the differential module 206, after passing through resistor R8 and resistor R9, respectively, can be connected to the input circuit 203 between resistor R5 and capacitor C2. In one embodiment, the capacitor C2 can have a capacitance of about 27 pF, resistor R5 and resistor R6 can each have a resistance of 2 kΩ and the resistor R7 can have a resistance of about 4.5 kΩ. However, in other embodiments, other resistances may be used for resistors R5, R6 and R7 and other capacitances may be used for capacitor C2. In a further embodiment, the input circuit 203 can be used for low pass or band pass filtering of frequencies of the electrical signal from the optical transceiver 63 as previously described with respect to input circuit 102.

The differential module 206 can provide an input voltage for the non-inverting input of the op-amp 90 to support signal maintenance when the optical transceiver 63 is AC coupled. The differential module 206 can be used to support signal maintenance during arbitrarily long periods of unchanging signal at the input connection 64 such as during idle times or during the transmission of long sequences of "1"s or "0"s. The input voltage from the differential module 206 can maintain a voltage at the non-inverting input of the op-amp 90 during times when the signal from an AC coupled optical transceiver 63 may sag or fluctuate. The differential module 206 can receive information from the processing module 69 regarding whether the optical transceiver 63 is AC coupled or DC coupled. If the optical transceiver 63 is DC coupled, the differential module 206 can be disabled or "no-loaded" in one embodiment. The differential module 202 can use the information from the processing module 69 to determine the appropriate input voltage to provide to the input circuit 203 (which is connected to the non-inverting input of op-amp 90) through resistor R9. In one embodiment, the differential module 206 can include an Schmidt trigger inverter and a line driver, but other configurations of the differential module can be used to provide the desired voltage to input circuit 203. In one embodiment, resistor R9 can have a resistance of about 15 kΩ, but can have other resistances in other embodiments.

FIG. 10 shows an embodiment of a coupling module 60 used with a differential signal. As shown in FIG. 10, the differential signal can have a positive (+) path and a negative (−) path for both input connection 64 and output connection 68. Each of the paths, i.e., the positive path and the negative path, can include a high pass module 65, a low pass module 67 and a linking circuit 70 to connect the input connection 64 and the output connection 68 and provide the appropriate level shift between the input connection 64 and the output connection 68. In addition, the coupling module 60 can use the differential module 206 to provide an input signal (or voltage) to the low pass modules 67 for both the positive path and the negative path. The differential module 206 can include a differential feedback circuit 222 to receive and process the information from the processing module 69. The output of the differential feedback circuit 222 can be inverted by inverter 224 and then split in order to be provided to the low pass modules 67 for the positive path and the negative path. The output from the inverter 224 is provided directly to the low pass module 67 for the positive path, but the output from the inverter 224 is inverted by inverter 226 before being provided to the low pass module 67 of the negative path. By providing opposed signals to the low pass modules 67 on the positive path and the negative path, the differential module 206 is able to maintain signal quality during idle times or during the transmission of long sequences of "1"s or "0"s.

Although the figures herein may show a specific order of method steps, the order of the steps may differ from what is depicted. Also, two or more steps may be performed concurrently or with partial concurrence. Variations in step performance can depend on the software and hardware systems chosen and on designer choice. All such variations are within the scope of the application. Software implementations could be accomplished with standard programming techniques, with rule based logic and other logic to accomplish the various connection steps, processing steps, comparison steps and decision steps.

The coupling module 60 is described in various embodiments for use within an OLT. However, it is possible to use the coupling module 60 in other types of communication devices, such as an ONU. As an example, an ONU may be configured according to the block diagram shown by FIG. 2 having a coupling module 60 that is coupled between and optical transceiver 63 and a processing module 69, as described above for the OLT 30.

Further, the use of the coupling module 60 is not limited to communication devices. In other embodiments, the coupling module 60 can be connected between an input module and an output module that require a level shift of the DC offset voltage or the common mode voltage in order for the modules to communicate. The coupling module 60 can adjust the DC offset voltage or common mode voltage of a signal received from the input module to enable the output module to process the signal.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. A coupling module comprising:
an input connection connected to a first input circuit to receive an input signal having a first DC offset voltage from the first input circuit;
a high pass filter connected to the input connection for receiving the input signal from the input connection, the high pass filter configured to filter the input signal and output a first filtered signal including signal frequencies greater than a first predetermined frequency;
a low pass filter connected to the input connection in parallel with the high pass filter for receiving the input signal from the input connection, the low pass filter configured to filter the input signal and output a second filtered signal including signal frequencies less than a second predetermined frequency, the low pass filter configured to adjust the first DC offset voltage of the input signal to provide a second DC offset voltage to the second filtered signal, wherein the second DC offset voltage is different from the first DC offset voltage; and
an output connection connected to the high pass filter and the low pass filter, the output connection for receiving the first filtered signal from the high pass filter and the second filtered signal from the low pass filter, the output connection configured to combine the first filtered signal and the second filtered signal to form a combined signal and provide the combined signal to a first output circuit,
wherein the second DC offset voltage of the second filtered signal corresponds to a DC offset voltage acceptable to the first output circuit.

2. The coupling module of claim 1, wherein:
the high pass filter comprises a capacitor having a capacitance, and wherein the capacitance of the capacitor is used to establish the first predetermined frequency; and
the low pass filter comprises an operational amplifier connected in series with the input connection, the operational amplifier configured to provide the second DC offset voltage to the second filtered signal.

3. The coupling module of claim 2, wherein the low pass filter further comprises:
a second output circuit connected to an output of the operational amplifier;
a feedback circuit connected between the output of the operational amplifier and an inverting input of the operational amplifier; and
a second input circuit connected to a non-inverting input of the operational amplifier,
wherein at least one of the second input circuit and the second output circuit is used to establish the second predetermined frequency.

4. The coupling module of claim 1, wherein the second DC offset voltage corresponds to a required DC offset voltage of the first output circuit.

5. The coupling module of claim 1, wherein the first filtered signal overlaps with the second filtered signal for a predetermined frequency range.

6. A coupling module comprising:
an input connection connected to a first input circuit to receive an input signal from the first input circuit;
a high pass filter connected to the input connection for receiving the input signal from the input connection, the high pass filter configured to filter the input signal and output a first filtered signal including signal frequencies greater than a first predetermined frequency, the high pass filter comprises a capacitor having a capacitance, and wherein the capacitance of the capacitor is used to establish the first predetermined frequency;
a low pass filter connected to the input connection in parallel with the high pass filter for receiving the input signal from the input connection, the low pass filter configured to filter the input signal and output a second filtered signal including signal frequencies less than a second predetermined frequency, the low pass filter comprises:
an operational amplifier connected in series with the input connection, the operational amplifier configured to provide a predetermined DC offset voltage to the second filtered signal;
a second output circuit connected to an output of the operational amplifier;
a feedback circuit connected between the output of the operational amplifier and an inverting input of the operational amplifier; and
a second input circuit connected to a non-inverting input of the operational amplifier, wherein at least one of the second input circuit and the second output circuit is used to establish the second predetermined frequency;
an output connection connected to the high pass filter and the low pass filter, the output connection for receiving the first filtered signal from the high pass filter and the second filtered signal from the low pass filter, the output connection configured to combine the first filtered signal and the second filtered signal to form a combined signal and provide the combined signal to a first output circuit, wherein the predetermined DC offset voltage of the second filtered signal corresponds to a DC offset voltage acceptable to the first output circuit; and
an attenuator circuit coupled to the output connection and configured to match a gain in the first filtered signal to a gain in the second filtered signal.

7. A coupling module comprising;
an input connection connected to a first input circuit to receive an input signal from the first input circuit;
a high pass filter connected to the input connection for receiving the input signal from the input connection, the high pass filter configured to filter the input signal and output a first filtered signal including signal frequencies greater than a first predetermined frequency, the high pass filter comprises a capacitor having a capacitance, and wherein the capacitance of the capacitor is used to establish the first predetermined frequency;
a low pass filter connected to the input connection in parallel with the high pass filter for receiving the input signal from the input connection, the low pass filter configured to filter the input signal and output a second filtered signal including signal frequencies less than a second predetermined frequency, the low pass filter comprises:
an operational amplifier connected in series with the input connection, the operational amplifier configured to provide a predetermined DC offset voltage to the second filtered signal;
a second output circuit connected to an output of the operational amplifier;
a feedback circuit connected between the output of the operational amplifier and an inverting input of the operational amplifier; and
a second input circuit connected to a non-inverting input of the operational amplifier, wherein at least one of the second input circuit and the second output circuit is used to establish the second predetermined frequency;
an output connection connected to the high pass filter and the low pass filter, the output connection for receiving the first filtered signal from the high pass filter and the second filtered signal from the low pass filter, the output connection configured to combine the first filtered signal and the second filtered signal to form a combined signal and provide the combined signal to a first output circuit, wherein the predetermined DC offset voltage of the second filtered signal corresponds to a DC offset voltage acceptable to the first output circuit; and
a differential circuit configured to provide an input signal to the second input circuit connected to the non-inverting input of the operational amplifier, wherein the input signal provided to the operational amplifier supports signal maintenance during long periods of unchanging signal at the input connection.

8. The coupling module of claim 7, wherein the differential circuit is configured to generate the input signal based on information from the first output circuit.

9. The coupling module of claim 8, wherein the differential circuit is configured to be disabled in response to information from the first output circuit that the first input circuit is DC coupled.

10. A coupling module comprising:
an input connection connected to a first input circuit to receive an input signal from the first input circuit;
a high pass filter connected to the input connection for receiving the input signal from the input connection, the high pass filter configured to filter the input signal and output a first filtered signal including signal frequencies greater than a first predetermined frequency, the high pass filter comprises a capacitor having a capacitance, and wherein the capacitance of the capacitor is used to establish the first predetermined frequency;
a low pass filter connected to the input connection in parallel with the high pass filter for receiving the input signal from the input connection, the low pass filter configured to filter the input signal and output a second filtered signal including signal frequencies less than a second predetermined frequency, the low pass filter comprises an operational amplifier connected in series with the input connection, the operational amplifier configured to provide a predetermined DC offset voltage to the second filtered signal;
an output connection connected to the high pass filter and the low pass filter, the output connection for receiving the first filtered signal from the high pass filter and the second filtered signal from the low pass filter, the output connection configured to combine the first filtered signal and the second filtered signal to form a combined signal and provide the combined signal to a first output circuit, wherein the predetermined DC offset voltage of the second filtered signal corresponds to a DC offset voltage acceptable to the first output circuit; and
a first offset circuit connected to an inverting input of the operational amplifier and configured to provide a first offset control voltage to the inverting input of the operational amplifier and a second offset circuit connected to a non-inverting input of the operational amplifier and configured to provide a second offset control voltage to the non-inverting input of the operational amplifier, wherein the predetermined DC offset voltage provided by the operational amplifier is dependent on the first offset control voltage and the second offset control voltage.

11. The coupling module of claim 10, wherein the first offset circuit is configured to generate the first offset control voltage based on information from the first output circuit and the second offset circuit is configured to generate the second offset control voltage based on information from the first output circuit.

12. The coupling module of claim 11, wherein the second offset circuit is configured to be disabled in response to information from the first output circuit that the first input circuit is DC coupled.

13. A coupling module comprising:
an input connection connected to a first input circuit to receive an input signal from the first input circuit;
a high pass filter connected to the input connection for receiving the input signal from the input connection, the high pass filter configured to filter the input signal and output a first filtered signal including signal frequencies greater than a first predetermined frequency, the high pass filter comprises a capacitor having a capacitance, and wherein the capacitance of the capacitor is used to establish the first predetermined frequency;
a low pass filter connected to the input connection in parallel with the high pass filter for receiving the input signal from the input connection, the low pass filter configured to filter the input signal and output a second filtered signal including signal frequencies less than a second predetermined frequency, the low pass filter comprises an operational amplifier connected in series with the input connection, the operational amplifier configured to provide a predetermined DC offset voltage to the second filtered signal;
an output connection connected to the high pass filter and the low pass filter, the output connection for receiving the first filtered signal from the high pass filter and the second filtered signal from the low pass filter, the output connection configured to combine the first filtered signal and the second filtered signal to form a combined signal and provide the combined signal to a first output circuit, wherein the predetermined DC offset voltage of the second filtered signal corresponds to a DC offset voltage acceptable to the first output circuit; and
an offset circuit configured to provide an offset control voltage to the operational amplifier, wherein the predetermined DC offset voltage provided by the operational amplifier is dependent on the offset control voltage, the offset circuit comprises a digital-to-analog converter configured to provide the offset control voltage to the operational amplifier, and the digital-to-analog converter is configured to generate the offset control voltage based on information from at least one of the first input circuit and the first output circuit.

14. A coupling module comprising:
an input connection connected to a first input circuit to receive an input signal from the first input circuit;
a high pass filter connected to the input connection for receiving the input signal from the input connection, the high pass filter configured to filter the input signal and output a first filtered signal including signal frequencies greater than a first predetermined frequency, the high pass filter comprises a capacitor having a capacitance, and wherein the capacitance of the capacitor is used to establish the first predetermined frequency;
a low pass filter connected to the input connection in parallel with the high pass filter for receiving the input signal from the input connection, the low pass filter configured to filter the input signal and output a second filtered signal including signal frequencies less than a second predetermined frequency, the low pass filter comprises a voltage regulator connected in series with the input connection, the voltage regulator configured to provide a predetermined DC offset voltage to the second filtered signal; and
an output connection connected to the high pass filter and the low pass filter, the output connection for receiving the first filtered signal from the high pass filter and the second filtered signal from the low pass filter, the output connection configured to combine the first filtered signal and the second filtered signal to form a combined signal and provide the combined signal to a first output circuit, wherein the predetermined DC offset voltage of the second filtered signal corresponds to a DC offset voltage acceptable to the first output circuit.

15. A method for communicating high speed signals between a first input circuit and a first output circuit, the method comprising:
receiving a high speed signal having a first DC offset voltage from the first input circuit;
splitting the high speed signal and providing the split high speed signal to a low pass filter and a high pass filter;
filtering the split high speed signal with the low pass filter to obtain a first filtered signal, the first filtered signal including signal frequencies of the high speed signal less than a first predetermined frequency;
filtering the split high speed signal with the high pass filter to obtain a second filtered signal, the second filtered signal including signal frequencies of the high speed signal greater than a second predetermined frequency;
adjusting the first DC offset voltage in the split high speed signal with the low pass filter to obtain a second DC offset voltage in the first filtered signal, wherein the second DC offset voltage is different from the first DC offset voltage;
combining the first filtered signal and the second filtered signal to obtain a combined signal; and
providing the combined signal with the second DC offset voltage to the first output circuit.

16. The method of claim 15, further comprising:
configuring at least one of a second input circuit and a second output circuit connected to an operational amplifier in the low pass filter to provide the first predetermined frequency; and
configuring a capacitor in the high pass filter to provide the second predetermined frequency.

17. The method of claim 15, wherein the step of adjusting the first DC offset voltage includes controlling the low pass filter with one or more signals from the first output circuit.

18. The method of claim 15, further comprising matching a gain in the first filtered signal to a gain in the second filtered signal with an attenuator circuit.

19. The method of claim 15, wherein:
the low pass filter comprises an operational amplifier and a second input circuit connected to a non-inverting input of the operational amplifier; and
the step of filtering the split high speed signal with the low pass filter includes providing an input signal to the second input circuit with a differential circuit, wherein the input signal provided to the operational amplifier supports signal maintenance during long periods of unchanging signal from the first input circuit.

20. The method of claim 15, wherein:
the low pass filter comprises an operational amplifier, a first offset circuit connected to an inverting input of the operational amplifier and configured to provide a first offset control voltage to the inverting input of the operational amplifier, and a second offset circuit connected to a non-inverting input of the operational amplifier and configured to provide a second offset control voltage to the non-inverting input of the operational amplifier; and the step of adjusting the first DC offset voltage includes adjusting the first DC offset voltage based on the first offset control voltage and the second offset control voltage.

21. The method of claim 15, wherein:

the low pass filter comprises an operational amplifier and an offset circuit configured to provide an offset control voltage to the operational amplifier, the offset circuit comprises a digital-to-analog converter configured to provide the offset control voltage to the operational amplifier, the digital-to-analog converter is configured to generate the offset control voltage based on information from at least one of the first input circuit and the first output circuit; and the step of adjusting the first DC offset voltage includes adjusting the first DC offset voltage based on the offset control voltage.

22. The method of claim 15, wherein:

the high pass filter comprises a capacitor having a capacitance, and wherein the capacitance of the capacitor is used to establish the second predetermined frequency; and the low pass filter comprises a voltage regulator, the voltage regulator configured to provide the second DC offset voltage to the first filtered signal.

23. A communication device comprising:

a transceiver configured to provide an electrical signal carrying a data stream at a first connection, the electrical signal having a first predetermined common mode voltage at the first connection;

a processing circuit comprising a second connection to receive an input signal having a second predetermined common mode voltage, the second predetermined common mode voltage being different from the first predetermined common mode voltage; and a coupling circuit connecting the transceiver and the processing circuit, the coupling circuit comprising:

a high pass filter connected to the first connection to receive the electrical signal, the high pass filter configured to filter the electrical signal and output a first filtered signal including signal frequencies of the electrical signal greater than a first predetermined frequency; and a low pass filter connected to the first connection to receive the electrical signal, the low pass filter being connected in parallel with the high pass filter, the low pass filter configured to filter the electrical signal and output a second filtered signal including signal frequencies of the electrical signal less than a second predetermined frequency, and the low pass filter configured to adjust the first predetermined common mode voltage in the electrical signal to provide the second predetermined common mode voltage in the second filtered signal, wherein the first filtered signal is combined with the second filtered signal to form a combined signal for the second connection to the processing circuit.

24. The communication device of claim 23, wherein:

the high pass filter comprises a first capacitor having a capacitance configured to filter the signal frequencies of the electrical signal less than the first predetermined frequency; and the low pass filter comprises an operational amplifier connected in series with the first connection, the operational amplifier configured to adjust the first predetermined common mode voltage to the second predetermined common mode voltage.

25. The communication device of claim 24, wherein the low pass filter further comprises:

a feedback circuit connected between an output of the operational amplifier and an inverting input of the operational amplifier;

an output circuit connected to the output of the operational amplifier; and an input circuit connected to a non-inverting input of the operational amplifier, wherein at least one of the input circuit and the output circuit is used to establish the second predetermined frequency.

26. A communication device comprising:

a transceiver configured to provide an electrical signal carrying a data stream at a first connection, the electrical signal having a first predetermined common mode voltage at the first connection;

a processing circuit comprising a second connection to receive an input signal having a second predetermined common mode voltage, the second predetermined common mode voltage being different from the first predetermined common mode voltage; and a coupling circuit connecting the transceiver and the processing circuit, the coupling circuit comprising:

a high pass filter connected to the first connection to receive the electrical signal, the high pass filter configured to filter the electrical signal and output a first filtered signal including signal frequencies of the electrical signal greater than a first predetermined frequency, the high pass filter comprises a capacitor having a capacitance configured to filter the signal frequencies of the electrical signal less than the first predetermined frequency; and a low pass filter connected to the first connection to receive the electrical signal, the low pass filter being connected in parallel with the high pass filter, the low pass filter configured to filter the electrical signal and output a second filtered signal including signal frequencies of the electrical signal less than a second predetermined frequency, the low pass filter comprises:

an operational amplifier connected in series with the first connection, the operational amplifier configured to adjust the first predetermined common mode voltage in the electrical signal to provide the second predetermined common mode voltage in the second filtered signal;

a feedback circuit connected between an output of the operational amplifier and an inverting input of the operational amplifier;

an output circuit connected to the output of the operational amplifier;

an input circuit connected to a non-inverting input of the operational amplifier, wherein at least one of the input circuit and the output circuit is used to establish the second predetermined frequency;

a first offset circuit configured to provide a first input voltage to the feedback circuit connected to the inverting input of the operational amplifier and a second offset circuit configured to provide a second input voltage to the input circuit connected to the non-inverting input of the operational amplifier, wherein the second predetermined common mode voltage in the second filtered signal provided by the operational amplifier is dependent on at least one of the first input voltage and the second input voltage; and the first offset circuit is configured to generate the first input voltage based on information from the processing circuit and the second offset circuit is configured to generate the second input voltage based on information from the processing circuit, wherein the first filtered signal is combined with the second filtered signal to form a combined signal for the second connection to the processing circuit.

27. The communication device of claim 26, wherein the input connection from the transceiver and the second connection to the processing circuit are configured for a differential signal having a positive path and a negative path, wherein the low pass filter further comprises a first low pass filter connected to the positive path and a second low pass filter connected to the negative path, the coupling circuit further comprises a differential circuit configured to provide a first input signal to the first low pass filter and a second input signal to the second low pass filter, wherein the differential circuit is configured to generate the first input signal and the second input signal based on information from the processing circuit, and the second input signal is an inversion of the first input signal.

* * * * *